United States Patent
Liu et al.

(10) Patent No.: US 12,325,224 B2
(45) Date of Patent: Jun. 10, 2025

(54) LIGHTWEIGHT, LOW-THICKNESS, DURABLE AND RELIABLE MULTI-BAND RADAR STEALTH-BULLETPROOF INTEGRATED METAMATERIAL

(71) Applicants: NORTH UNIVERSITY OF CHINA, Taiyuan (CN); SHANXI ZHONGBEI NEW MATERIAL TECHNOLOGY CO., LTD., Taiyuan (CN)

(72) Inventors: Yaqing Liu, Taiyuan (CN); Guanyu Han, Taiyuan (CN); Chaoyang Wu, Taiyuan (CN); Guizhe Zhao, Taiyuan (CN)

(73) Assignees: NORTH UNIVERSITY OF CHINA, Taiyuan (CN); SHANXI ZHONGBEI NEW MATERIAL TECHNOLOGY CO., LTD., Taiyuan (CN)

( * ) Notice: Subject to any disclaimer, the term of this patent is extended or adjusted under 35 U.S.C. 154(b) by 0 days.

(21) Appl. No.: 18/809,596

(22) Filed: Aug. 20, 2024

(65) Prior Publication Data
US 2024/0408846 A1 Dec. 12, 2024

Related U.S. Application Data

(63) Continuation of application No. PCT/CN2023/096209, filed on May 25, 2023.

(30) Foreign Application Priority Data

Apr. 6, 2023 (CN) .......................... 202310354945.2

(51) Int. Cl.
B32B 9/00 (2006.01)
B32B 3/14 (2006.01)
(Continued)

(52) U.S. Cl.
CPC ................ *B32B 9/005* (2013.01); *B32B 3/14* (2013.01); *B32B 9/047* (2013.01); *B32B 27/12* (2013.01);
(Continued)

(58) Field of Classification Search
None
See application file for complete search history.

(56) References Cited

U.S. PATENT DOCUMENTS

2018/0335282 A1    11/2018    Ganor

FOREIGN PATENT DOCUMENTS

| CN | 108559247 A | 9/2018 |
|----|-------------|--------|
| CN | 110360886 A | 10/2019 |

(Continued)

OTHER PUBLICATIONS

General Armaments Department of the People's Liberation Army (PLA), "GJB 2038A-2011 the measurement methods for reflectivity of radar absorbing material", May 22, 2011, 6 Bow test method.

*Primary Examiner* — Samir Shah

(57) ABSTRACT

A lightweight, low-thickness, durable, and reliable multi-band radar stealth-bulletproof integrated metamaterial includes a ceramic layer, an ultrahigh molecular weight polyethylene (UHMWPE) fiber composite bulletproof layer, a graphene-based metamaterial filter layer, an UHMWPE fiber composite attenuation layer, and a carbon fiber composite reflective layer stacked in sequence. The two UHMWPE fiber composite layers are configured to attenuate radar waves. The circuit resonance of the graphene-based metamaterial filter layer is configured to generate a passband and a stopband simultaneously. The bulletproof layer and the attenuation layer are controlled by the graphene-based metamaterial filter layer in terms of working conditions in different radar frequency bands to establish a structure (Continued)

capable of generating λ/4 resonance at both low and high frequencies, so as to arrive at a stealth-bulletproof integrated metamaterial with small thickness and excellent dual-band radar wave absorption capability.

9 Claims, 9 Drawing Sheets

(51) Int. Cl.
  *B32B 9/04* (2006.01)
  *B32B 27/12* (2006.01)
  *B32B 27/16* (2006.01)
  *B32B 27/28* (2006.01)
  *F41H 5/04* (2006.01)
  *H05K 9/00* (2006.01)

(52) U.S. Cl.
  CPC ............ *B32B 27/16* (2013.01); *B32B 27/281* (2013.01); *F41H 5/0428* (2013.01); *H05K 9/0088* (2013.01); *B32B 2260/021* (2013.01); *B32B 2260/046* (2013.01); *B32B 2262/0253* (2013.01); *B32B 2262/106* (2013.01); *B32B 2305/08* (2013.01); *B32B 2305/188* (2013.01); *B32B 2307/204* (2013.01); *B32B 2307/208* (2013.01); *B32B 2307/558* (2013.01); *B32B 2307/72* (2013.01); *B32B 2307/7376* (2023.05)

(56) References Cited

FOREIGN PATENT DOCUMENTS

| | | |
|---|---|---|
| CN | 112414218 A | 2/2021 |
| CN | 112776372 A | 5/2021 |
| KR | 102388096 B1 | 4/2022 |

LIGHTWEIGHT, LOW-THICKNESS, DURABLE AND RELIABLE MULTI-BAND RADAR STEALTH-BULLETPROOF INTEGRATED METAMATERIAL

CROSS-REFERENCE TO RELATED APPLICATIONS

This application is a continuation of International Patent Application No. PCT/CN2023/096209, filed on May 25, 2023, which claims the benefit of priority from Chinese Patent Application No. 202310354945.2, filed on Apr. 6, 2023. The content of the aforementioned application, including any intervening amendments thereto, is incorporated herein by reference in its entirety.

TECHNICAL FIELD

This application relates to functional composites, and more particularly to a lightweight, low-thickness, durable and reliable multi-band radar stealth-bulletproof integrated metamaterial.

BACKGROUND

Bulletproof materials are the basis for manufacturing composite armor units to enable the armor protection, and the key to supporting the battlefield survivability of main combat vehicles, command vehicles, and logistics support vehicles. With the development of various types of kinetic-energy weapons in the tendency of ultra-high speed and super-power, and the increasing progress of reconnaissance and strike technologies, the radar stealth-bulletproof integration technology for armor materials has become an important factor in determining the battlefield survivability of armor weapons, and therefore have received extensive attention.

At present, in China, the protection of armored vehicles is dominated by metal-ceramic composite bulletproof materials. However, these metal-ceramic composites struggle with large structural weight, easy corrosion, and poor radar stealth effect, and fail to meet requirements of the armor weapons for the radar stealth and bulletproof functions in modern warfare. The laminated armor materials that are currently studied abroad are mostly composed of ceramic layers and fiber-reinforced composite layers, and have the advantages of light weight and good bulletproof effect. However, it has been rarely reported about the laminated armor materials that have both bulletproof and radar stealth functions. How to make a laminated armor integrating the bulletproof and multi-band radar stealth functions without significantly increasing the thickness and surface density has currently become the research hot spot and main challenge in the field of armor materials.

Metamaterials are a class of artificial composite structures or composites with extraordinary physical properties not possessed by natural materials such as negative permittivity, negative permeability, negative refractive index, and inverse Doppler effect. The properties of metamaterials not only depend on the intrinsic properties of the constituent materials, such as electrical conductivity and electromagnetic parameters, but also on the pattern shape, size, and arrangement of unit structures. In recent years, various applications of the metamaterials in microwave band and terahertz band, such as perfect lens, perfect absorption, dielectric antenna, polarization control, invisibility cloak, etc., have attracted much attention, and the radar stealth is considered as one of the most notable spots. Metamaterials can not only overcome the bottleneck of traditional absorbing materials in the low-frequency band, but also have the characteristics of small size, low thickness, and light weight, exhibiting a great potential in the radar stealth. The metamaterial absorbers have the same absorbing mechanism as the conventional radar-absorbing materials, in which the incident radar wave energy is converted into other forms of energy to be dissipated. The unit structure of metamaterials can be designed to reach the near-perfect absorption of radar waves while breaking the thickness limit of $\lambda/4$.

The unit structure of conventional metamaterials consists of a top metal pattern layer, a middle dielectric layer, and a bottom metal backplane, presenting a classical metal/dielectric/metal structure, which is adopted in most of single-layer and multi-layer metamaterial absorbers. Through the reasonable optimization of structural parameters, a strong electromagnetic resonance can be generated between the metal pattern resonance unit and the bottom metal backplane, so that the input impedance of the metamaterial absorber matches the impedance of the free space, thereby enabling the almost complete adsorption of the incident radar waves (almost without reflection). Such metamaterial absorber that can almost completely absorb the radar wave energy is also called a metamaterial-based perfect absorber. However, such classical structure is sensitive to polarization and has a narrow absorption band, and the bottom metal backplane and the top metal pattern patch are required to be strictly aligned with each other to reach the ideal absorption effect, leading to high requirements for the fabrication process.

In order to expand the absorption bandwidth of metamaterials, researchers at home and abroad have explored a variety of methods. However, the absorption bandwidth of metamaterial absorbers is still unsatisfactory, and there are still few reports on metamaterial absorbers that cover multiple wavebands completely across the wavebands at home and abroad. In addition, the existing broadband metamaterial absorbers have the following problems: the absorption band is not smooth, and there may still be a certain amount of radar wave reflection in the band; good absorption performance is over-reliant on the surface pattern, which will lead to serious deterioration of the absorption performance after local damage; and the metal pattern in the structure is prone to rust and corrosion, resulting in poor weather resistance. All the problems greatly reduce the reliability of the existing broadband metamaterial absorbers in harsh environments for long service.

To address the above problems, this application provides a multifunctional integrated design of the laminated ceramic/fiber resin composite structure. Based on the fiber resin composite layer in the main bulletproof structure, the quarter wavelength theory, and the circuit resonance theory, the circuit resonance of the metamaterial filter layer is used to generate passband and stopband. By controlling the working conditions of the fiber resin composite layer in different radar wave frequency bands, a structure that can generate $\lambda/4$ resonance at low frequency and high frequency at the same time is established, so as to obtain a bulletproof structure-based stealth metamaterial with light weight, thin thickness, and excellent absorption ability in dual bands, thereby realizing the effective synergy between bulletproof performance and radar stealth performance. In addition, the absorbing performance mainly comes from the fiber resin composite layer and is not over-reliant on the metamaterial pattern, so the metamaterial in this application can still maintain the ability to cope with radar detection after suffering a certain degree of damage, ensuring the reliability in long-term service.

SUMMARY

In order to solve the problems that the existing broadband metamaterial absorbers have single function, poor reliability and weak service performance, and cannot be used in stealth armor platforms, this application provides a lightweight, low-thickness, durable and reliable multi-band radar stealth-bulletproof integrated metamaterial.

Technical solutions of this application are described as follows.

This application provides a multi-band radar stealth-bulletproof integrated metamaterial, including:
a ceramic layer;
a bulletproof layer;
a filter layer;
an attenuation layer; and
a reflective layer;
wherein the ceramic layer, the bulletproof layer, the filter layer, the attenuation layer, and the reflective layer are stacked in sequence, and the ceramic layer is configured to serve as a projectile facing surface;
the bulletproof layer is made of a first ultrahigh molecular weight polyethylene (UHMWPE) fiber composite; the filter layer is a graphene-based metamaterial layer; the attenuation layer is made of a second UHMWPE fiber composite; and the reflective layer is a carbon fiber-based composite layer;
the bulletproof layer and the attenuate layer are configured to attenuate incident radar waves;
a circuit resonance of the filter layer is configured to simultaneously generate a passband and a stopband for the incident radar waves;
the bulletproof layer and the attenuation layer are configured to be controlled by the filter layer in terms of working conditions within different incident radar frequency bands to establish a structure capable of generating $\lambda/4$ resonance at both low and high frequencies, so as to arrive at a stealth-bulletproof integrated structure with dual-band absorption capability, thereby achieving integration of bulletproof performance and radar stealth performance.

In an embodiment, the ceramic layer is formed by splicing a plurality of ceramic pieces in a shape of regular triangle, square, or regular hexagon; and
each of the plurality of ceramic pieces has a thickness $a_1$ of 5~10 mm, a side length of 50~100 mm, a density $\rho_1$ of 1~5 g/cm$^3$, a permittivity $\varepsilon_{r1}$ of 2~3, and a dielectric loss angle tangent value tan $\delta_{e1}$ of 0.001~0.01.

In an embodiment, the bulletproof layer is the first UHMWPE fiber-resin composite layer having a thickness $a_2$ of 1.1~5 mm, a density $\rho_2$ of 0.5~2 g/cm$^3$, a permittivity $\varepsilon_{r2}$ of 5~12, a dielectric loss angle tangent value tan $\delta_{e2}$ of 0.2~0.3, a permeability $\mu_2$ of 2~4, a magnetic loss angle tangent value tan $\delta_{\mu2}$ of 0.05~0.1, a Young's modulus $E_2$ of 0.1~10 GPa, a Poisson's ratio $v_2$ of 0.01~0.02, and a shear modulus $G_2$ of 0.1~3 GPa.

In an embodiment, the filter layer includes a polyimide film as a substrate and conductive graphene as a pattern layer; a total thickness $a_4$ of the filter layer is 0.1-0.5 mm; and sheet resistance $R_4$ of the filter layer is 0.1-5 Ω/sq.

In an embodiment, the attenuation layer is the second UHMWPE fiber-resin composite layer having a thickness $a_3$ of 0.9~5 mm, a density $\rho_3$ of 0.5~2 g/cm$^3$, a permittivity $\varepsilon_{r3}$ of 5~12, a dielectric loss angle tangent value tan $\delta_{e3}$ of 0.2~0.3, a permeability $\mu_3$ of 1~4, a magnetic loss angle tangent value tan $\delta_{\mu3}$ of 0~0.1, a Young's modulus $E_3$ of 0.1~10 GPa, a Poisson's ratio $v_3$ of 0.01~0.02, and a shear modulus $G_3$ of 0.1~3 GPa.

In an embodiment, the reflective layer is a carbon fiber-resin composite layer having a thickness $a_5$ of 1~4 mm, a density $\rho_5$ of 2~4 g/cm$^3$, an electrical conductivity $\sigma_5$ of $10^4$~$10^5$ S/m, a Young's modulus $E_5$ of 10~300 GPa, a Poisson's ratio $v_5$ of 0.3~0.4, and a shear modulus $G_5$ of 0.1~5 GPa.

In an embodiment, each of the plurality of ceramic pieces is made from boron carbide, boron nitride, alumina, silicon carbide, silicon nitride, or a combination thereof.

In an embodiment, the first UHMWPE fiber-resin composite layer includes a reinforcement, a resin matrix, a curing agent, and a wave-absorbing filler;
the reinforcement is selected from the group consisting of UHMWPE fiber plain fabric, UHMWPE fiber twill fabric, UHMWPE fiber unidirectional fabric, and a combination thereof,
the resin matrix is epoxy resin;
the curing agent is an amine-based curing agent or an anhydride-based curing agent; and
the wave-absorbing filler is selected from the group consisting of graphene, carbon nanotube, ferroferric oxide, carbonyl iron, α-Fe and a combination thereof.

In an embodiment, the second UHMWPE fiber-resin composite layer includes a reinforcement, a resin matrix, a curing agent, and a wave-absorbing filler;
the reinforcement is selected from the group consisting of UHMWPE fiber plain fabric, UHMWPE fiber twill fabric, UHMWPE fiber unidirectional fabric, and a combination thereof,
the resin matrix is epoxy resin;
the curing agent is an amine-based curing agent or an anhydride-based curing agent; and
the wave-absorbing filler is selected from the group consisting of graphene, carbon nanotube, ferroferric oxide, carbonyl iron, α-Fe, and a combination thereof.

In an embodiment, the carbon fiber-resin composite layer includes a reinforcement, a resin matrix, and a curing agent;
the reinforcement is selected from the group consisting of carbon fiber plain fabric, carbon fiber twill fabric, carbon fiber unidirectional fabric and a combination thereof;
the resin matrix is epoxy resin; and
the curing agent is an amine-based curing agent or an anhydride-based curing agent.

Compared to the prior art, this application has the following beneficial effects.

(1) The application effectively integrates the bulletproof structure and radar stealth metamaterial, which is based on the UHMWPE fiber-resin composite layer in the main bulletproof structure, obtains electromagnetic energy loss capability through the regulation of electromagnetic parameters, and obtains a stealth metamaterial with light weight, thin thickness and multi-band wave absorption performance based on bulletproof structure through structural design, realizing the effective synergy between bulletproof function and radar stealth function.

(2) The application uses two layers of UHMWPE fiber resin composite as the attenuation layer, and utilizes the circuit resonance of the graphene-based metamaterial layer to generate a passband and a stopband simultaneously, and controls the working condition of the two layers of UHMWPE fiber-resin composite in different radar bands, and then establishes a structure that can generate λ/4 resonance at both low and high frequencies at the same time, and achieves a wide absorption in multiple bands. Moreover, the absorbing performance depends on both the fiber-resin composite layers and the absorbing metamaterial, and does not depend excessively on the metamaterial pattern, thus making the prepared radar stealth-bulletproof integrated fiber-reinforced resin composite metamaterial maintain the ability to cope with radar detection after suffering a certain degree of damage, and greatly improving the reliability.

(3) The application uses a conductive graphene-based filter layer to replace the metal-patterned metamaterial commonly used in current international research, which can solve the interface bonding problem and the reliability problem in long-term service and/or harsh environments commonly found in current stealth metamaterials.

BRIEF DESCRIPTION OF THE DRAWINGS

The accompanying drawings herein are incorporated to form a part of the specification to illustrate some embodiments of the disclosure, and are used in conjunction with the description to explain the principles of the disclosure.

In order to illustrate the embodiments of the disclosure or the technical solution in the prior art more clearly, the drawings required in the description of the embodiments or the prior art will be briefly described below. Obviously, presented in the drawings are merely some embodiments of the present disclosure, which are not intended to limit the disclosure. For those skilled in the art, other drawings may also be obtained according to the drawings provided herein without paying creative efforts.

FIG. 4a: Example 2 and Comparative Example 1; FIG. 4b: Example 3; FIG. 4c: Example 4; and FIG. 4d: Example 5.

DETAILED DESCRIPTION OF EMBODIMENTS

Figure 1:
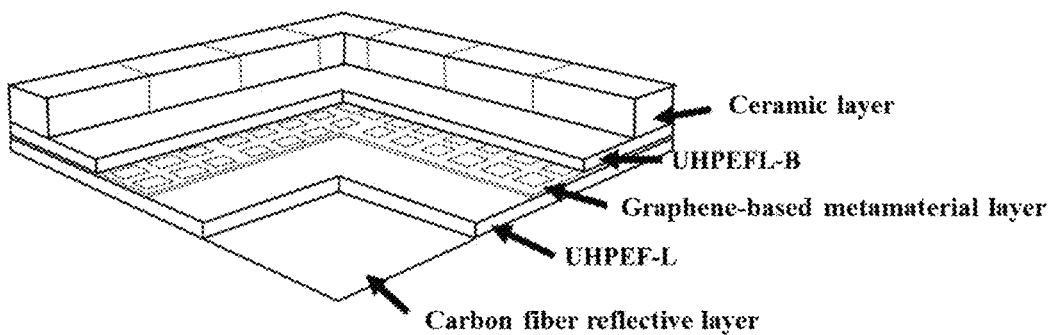
FIG. 1 schematically shows an overall structure of an integrated metamaterial according to one embodiment of the present disclosure.

The present disclosure will be further described in detail below to make the above objects, features, and advantages of the present disclosure clearer. It should be noted that embodiments of the present application and the features therein may be combined with each other in the absence of contradiction.

Many specific details are described to facilitate the full understanding of the disclosure, but the disclosure may also be implemented in other ways than those described herein. Obviously, presented in the drawings are merely some embodiments of the present disclosure, which are not intended to limit the disclosure.

The simulation software used in the disclosure is introduced as follows:

(1) Bulletproof mechanical simulation: engineering simulation finite element software ABAQUS 2020.

(2) Electromagnetic simulation: microwave radio frequency simulation software CST microwave studio 2021.

The radar wave reflection loss of the present disclosure is determined by the following test method.

According to GJB 2038A-2011 "The measurement methods for reflectivity of radar absorbing material", the prepared samples are tested for radar wave reflection loss by a bow test method.

The present disclosure provides a lightweight, low-thickness, durable, and reliable multi-band radar stealth-bulletproof integrated metamaterial, which includes a ceramic layer, a bulletproof layer, a filter layer, an attenuation layer, and a reflective layer, which are stacked in sequence and the ceramic layer serves as the projectile facing surface. The bulletproof layer is an ultrahigh molecular weight polyethylene fiber composite bulletproof layer (UHMWPE fiber bulletproof layer; UHPEF-B). The filter layer is a graphene-based metamaterial layer. The attenuation layer is an ultra-high molecular weight polyethylene fiber composite attenuation layer (UHMWPE Fiber Attenuation layer; UHPEF-L). The reflective layer is a carbon fiber-based composite layer.

The principle of the present disclosure to achieve ballistic performance is as follows.

The ceramic layer/UHPEF-B acts as the main bulletproof structure. The ceramic layer at the ballistic face can attenuate the warhead and consume the energy of the projectile, and play a key role in the overall armor protection system to determine the bulletproof performance. After passing through the ceramic layer, the attenuated warhead and the fragments generated by the damaged ceramic layer still have certain kinetic energy. The UHMWPE fiber resin composite bulletproof layer can maintain the stability of the bulletproof system, prolong the penetration time of the projectile, enhance the effect of the ceramic layer, and absorb the remaining kinetic energy to achieve a good protection effect against the impact of the projectile. The reflective layer in the bottom layer provides sufficient mechanical support for the overall structure with the high stiffness.

The principle of the present disclosure to achieve multi-band broadband radar stealth performance is as follows.

In the low frequency band (i.e., 2-18 GHz), the graphene-based metamaterial layer allows radar waves to pass through, and based on the quarter wavelength theory, λ/4 resonant frequency points are generated by the combined effects of UHPEF-B, UHPEF-L, and the carbon fiber reflective layer. In the high frequency band (i.e., 18-40 GHz), the graphene filter layer presents the characteristic of reflecting radar waves and generates λ/4 resonant frequency points with the UHPEF-B above. Since both UHPEF-B and UHPEF-L are lossy materials after the modulation of electromagnetic parameters, broadband absorption will be produced in the above-mentioned operating band.

In an embodiment, the ceramic layer is formed by splicing by a plurality of ceramic pieces in the shape of regular triangle, square, or regular hexagon. Each of the plurality of ceramic pieces has the thickness $a_1$ of 5~10 mm, the side length of 50~100 mm, the density $\rho_1$ of 1~5 g/cm$^3$, the permittivity $\varepsilon_{r1}$ of 2~3, and the dielectric loss angle tangent value tan $\delta_{e1}$ of 0.001~0.01.

In an embodiment, the bulletproof layer is the UHMWPE fiber-resin composite layer having the thickness $a_2$ of 1.1~5 mm and the density $\rho_2$ of 0.5~2 g/cm$^3$. The electromagnetic parameters of the bulletproof layer: the permittivity $\varepsilon_{r2}$ of 5~12; the dielectric loss angle tangent value tan $\delta_{e2}$ of 0.2~0.3; the permeability $\mu_2$ of 2~4; and the magnetic loss angle tangent value tan $\delta_{\mu2}$ of 0.05~0.1. The mechanical parameters of the bulletproof layer: the Young's modulus $E_2$ of 0.1~10 GPa; the Poisson's ratio $v_2$ of 0.01~0.02; and the shear modulus $G_2$ of 0.1~3 GPa.

In an embodiment, the filter layer has a polyimide film as the substrate and conductive graphene as the patterning layer. The total thickness $a_4$ of the filter layer is 0.1~0.5 mm, and the sheet resistance $R_4$ of the filter layer is 0.1~5 Ω/sq.

In an embodiment, the attenuation layer is the UHMWPE fiber-resin composite layer having the thickness $a_3$ of 0.9~5 mm and the density $\rho_3$ of 0.5~2 g/cm$^3$. The electromagnetic parameters of the attenuation layer: the permittivity $\varepsilon_{r3}$ of 5~12; the dielectric loss angle tangent value tan $\delta_{e3}$ of 0.2~0.3; the permeability $\varepsilon_{r3}$ of 1~4; and the magnetic loss angle tangent value tan $\delta_{\mu 3}$ of 0~0.1. The mechanical parameters of the attenuation layer: the Young's modulus $E_3$ of 0.1~10 GPa; the Poisson's ratio $v_3$ of 0.01~0.02; and the shear modulus $G_3$ of 0.1~3 GPa.

In an embodiment, the reflective layer is the carbon fiber-resin composite layer having the thickness $a_5$ of 1~4 mm and the density $\rho_5$ of 2~4 g/cm$^3$. The electrical conductivity $\sigma_5$ of the reflective layer is $10^4$~$10^5$ S/m. The mechanical parameters of the reflective layer: the Young's modulus $E_5$ of 10~300 GPa; the Poisson's ratio $v_5$ of 0.3~0.4; and the shear modulus $G_5$ of 0.1~5 GPa.

In an embodiment, each of the plurality of ceramic pieces is made from boron carbide, boron nitride, alumina, silicon carbide, silicon nitride, or a combination thereof.

In an embodiment, the UHMWPE fiber-resin composite layer includes reinforcement, resin matrix, curing agent, and wave-absorbing filler. The reinforcement is selected from the group consisting of UHMWPE fiber plain fabric, UHMWPE fiber twill fabric, UHMWPE fiber unidirectional fabric, or a combination thereof. The resin matrix is epoxy resin. The curing agent is amine-based curing agent or anhydride-based curing agent. The wave-absorbing filler is selected from the group consisting of graphene, carbon nanotube, ferroferric oxide, carbonyl iron, α-Fe, and a combination thereof.

In an embodiment, the carbon fiber-resin composite layer includes reinforcement, resin matrix, and curing agent. The reinforcement is selected from the group consisting of carbon fiber plain fabric, carbon fiber twill fabric, carbon fiber unidirectional fabric, a combination thereof. The resin matrix is epoxy resin. The curing agent is amine-based curing agent or anhydride-based curing agent.

In an embodiment, the ceramic layer is prepared by the following steps: preparing the base from boron carbide and silicon carbide inorganic powder; sintering at high temperature and applying axial pressure; cooling to get ceramic piece; and assembling to get the ceramic layer.

In an embodiment, the UHPEF-B and the UHPEF-L are prepared by the following steps: mixing the wave-absorbing filler and resin in different ratios evenly; adhering the particles of the wave-absorbing filler closely to the surface of the UHPEF unidirectional (UD) fabric by high pressure injection; and obtaining UHPEF-B or UHPEF-L by hot press molding.

In an embodiment, the filter layer is prepared by the following steps: pouring graphene conductive ink at one end of the screen printing plate; applying certain pressure on the ink on the screen printing plate by the squeegee while moving at a uniform speed toward the other end of the screen printing plate, wherein the ink is scraped by the squeegee from the mesh of the screen printing plate into the polyimide film substrate during moving; and finally drying and shaping to obtain the filter layer.

In an embodiment, the reflective layer is prepared by the following steps: fully saturating the carbon fiber fabric with resin; laying the layer according to the designed thickness; and finally curing in the hot press tank with a certain pressure to obtain the reflective layer.

In an embodiment, the lightweight, low-thickness, durable and reliable multi-band radar stealth-bulletproof integrated metamaterial is prepared by the following steps: according to the designed structure, the component parts are bonded with resin and molded in the hot press tank to obtain the integrated metamaterial.

The disclosure will be further described in detail in conjunction with Examples 1-5 and Comparative Example 1.

Example 1

Structural and performance parameters of individual layers of a lightweight, low-thickness, durable, and reliable multi-band radar stealth-bulletproof integrated metamaterial provided herein were described as follows.

Ceramic layer: thickness $a_1$=10 mm; density $\rho_1$=2.52 g/cm$^3$; material was boron carbide; permittivity $\varepsilon_{r1}$=2; dielectric loss angle tangent value tan $\delta_{e1}$=0.001; and shape of ceramic piece was square, and side length of the square was 100 mm.

UHPEF-B: thickness $a_2$=5 mm; density $\rho_2$=1.40 g/cm$^3$; permittivity $\varepsilon_{r2}$=6; dielectric loss angle tangent value tan $\delta_{e2}$=0.2; permeability $\mu_2$=2; magnetic loss angle tangent value tan $\delta_{\mu 2}$=0.1; Young's modulus $E_2$=3.62 GPa; Poisson's ratio $v_2$=0.013; and shear modulus $G_2$=2 GPa. The reinforcement was UHMWPE fiber unidirectional fabric. The resin matrix was E-51 epoxy resin. The curing agent was hexahydrophthalic anhydride (HHPA). The mass ratio of the reinforcement to the resin matrix to the curing agent was 1:0.24:0.3. The added wave-absorbing filler was carbonyl iron and graphene, which accounted for 20 wt. % and 0.5 wt. % of the total mass of UHPEF-B, respectively.

Filter layer: total thickness $a_4$=0.1 mm; polyimide film as the substrate with the thickness $a_{4(1)}$=0.05 mm; and rectangle-shaped surface pattern with thickness $a_{4(2)}$=0.05 mm, side length $a_{4(3)}$=22 mm, width $a_{4(4)}$=3.5 mm, and sheet resistance $R_4$=0.1 Ω/sq.

UHPEF-L: thickness $a_3$=5 mm; density $\rho_3$=1.40 g/cm$^3$; permittivity $\varepsilon_{r3}$=6; dielectric loss angle tangent value tan $\delta_{e3}$=0.2; permeability $\mu_3$=2; magnetic loss angle tangent value tan $\delta_{\mu 3}$=0.1; $E_3$=3.62 GPa; $v_3$=0.013; and $G_3$=2 GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was carbonyl iron and graphene, accounting for 20 wt. % and 0.5 wt. % of the total mass of UHPEF-L, respectively.

Reflective layer: thickness $a_5$=3 mm; density $\rho_5$=2.19 g/cm$^3$; electrical conductivity $\sigma_5$=5.9×10$^4$ S/m; $E_5$=235 GPa; $v_5$=0.32; and $G_5$=4.5 GPa. The reinforcement was carbon fiber plain fabric. The resin matrix was E-51 epoxy resin. The curing agent was HHPA. The mass ratio of the reinforcement to the resin matrix to the curing agent was 1:0.19:0.24.

Figure 2:
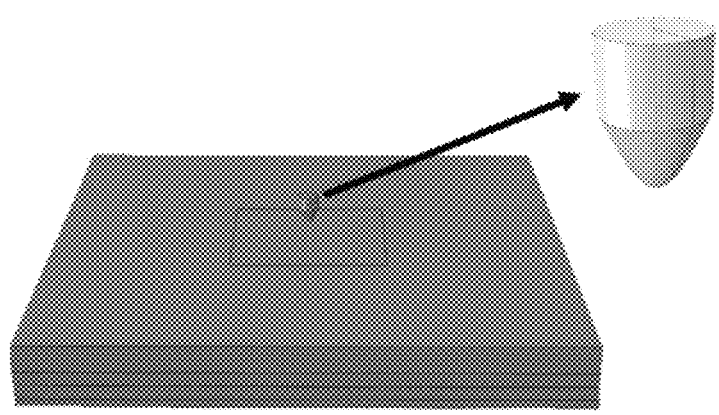
FIG. 2 schematically shows a bulletproof simulation model according to Example 1 of the present disclosure.
Figure 3:
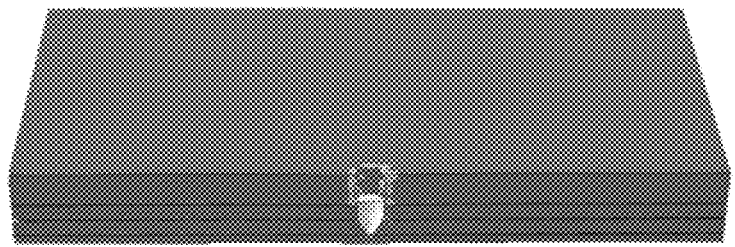
FIG. 3 schematically shows a bulletproof simulation result according to Example 1 of the present disclosure.

ABAQUS was used to perform simulation modeling for the bulletproof mechanical performance of the multi-band radar stealth-bulletproof integrated metamaterial. The results were shown in FIG. 2. The simulation process was performed with a 7.62×51 mm NATOFMJ M80 bullet and the initial velocity of 847±9 m/s. The final stress distribution cloud was shown in FIG. 3.

It could be seen that when the velocity of the projectile dropped to 0, the projectile penetrated the ceramic layer and the UHPEF-B layer and stayed in the UHPEF-L layer. The carbon fiber-resin composite layer at the structure bottom had sufficient stiffness, and thus no back-bumping phenomenon occurred. Because of the reasonable design of the composite material, the structural integrity could be effectively maintained after bearing the bullet impact. The simulation results showed that the multi-band radar stealth-bulletproof integrated metamaterial had good protection capability against conventional ballistic attacks.

Example 2

Structural and performance parameters of individual layers of the lightweight, low-thickness, durable, and reliable multi-band radar stealth-bulletproof integrated metamaterial provided herein were described as follows.

Ceramic layer: thickness $a_1=10$ mm; density $\rho1=2.52$ g/cm$^3$; material was boron carbide; permittivity $\varepsilon_{r1}=2$; dielectric loss angle tangent value tan $\delta_{e1}=0.001$; and shape of the ceramic piece was square, and side length of the square was 100 mm.

UHPEF-B: thickness $a_2=5$ mm; density $\rho_2=1.40$ g/cm$^3$; permittivity $\varepsilon_{r2}=6$; dielectric loss angle tangent value tan $\delta_{e2}=0.2$; permeability $\mu_2=2$; magnetic loss angle tangent value tan $\delta_{\mu2}=0.1$; Young's modulus $E_2=3.62$ GPa; Poisson's ratio $v_2=0.013$; and shear modulus $G_2=2$ GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was carbonyl iron and graphene, accounting for 20 wt. % and 0.5 wt. % of the total mass of UHPEF-B, respectively.

Filter layer: total thickness $a_4=0.1$ mm; polyimide film as the substrate with the thickness $a_{4(1)}=0.05$ mm; and rectangle-shaped surface pattern with thickness $a_{4(2)}=0.05$ mm, side length $a_{4(3)}=22$ mm, width $a_{4(4)}=3.5$ mm, and sheet resistance $R_4=0.1$ Ω/sq.

UHPEF-L: thickness $a_3=5$ mm; density $\rho_3=1.40$ g/cm$^3$; permittivity $\varepsilon_{r3}=6$; dielectric loss angle tangent value tan $\delta_{e3}=0.2$; permeability $\mu_3=2$; magnetic loss angle tangent value tan $\delta_{\mu3}=0.1$; $E_3=3.62$ GPa; $v_3=0.013$; and $G_3=2$ GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was carbonyl iron and graphene, accounting for 20 wt. % and 0.5 wt. % of the total mass of UHPEF-L, respectively.

Reflective layer: thickness $a_5=3$ mm; density $\rho_5=2.19$ g/cm$^3$; electrical conductivity $\sigma_5=5.9\times10^4$ S/m; $E_5=235$ GPa; $v_5=0.32$; and $G_5=4.5$ GPa. The reinforcement was carbon fiber plain fabric. The resin matrix was E-51 epoxy resin. The curing agent was HHPA. The mass ratio of the reinforcement to the resin matrix to the curing agent was 1:0.19:0.24.

Figure 4A:
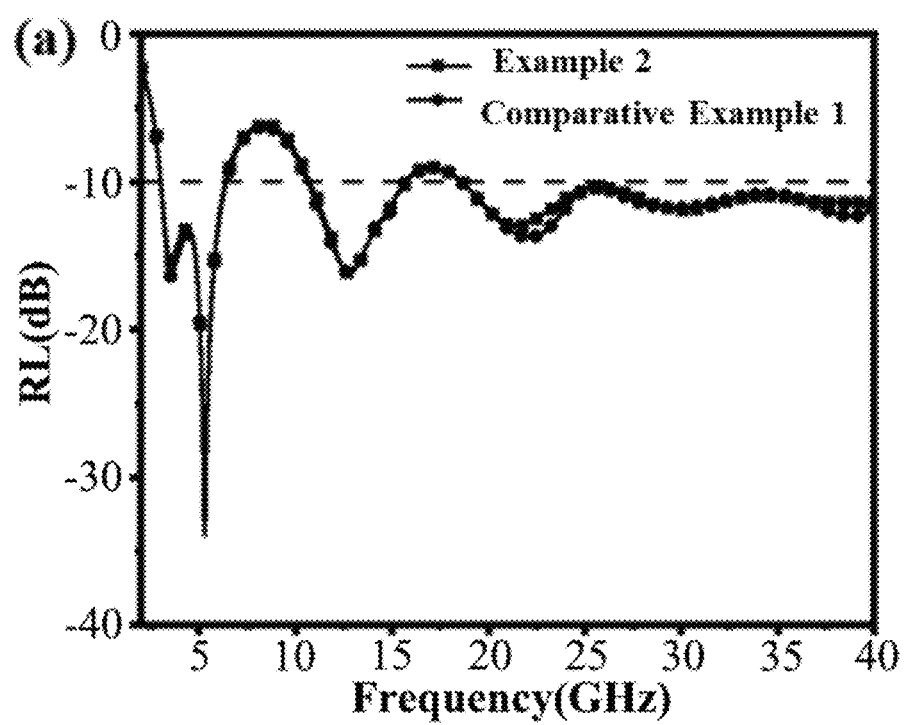
FIGS. 4a-4d show curves of radar wave reflection loss (RL) with frequency, where

The curves of the radar wave reflection loss (RL) of the radar stealth-bulletproof integrated metamaterial in the radar wave frequency range of 2~40 GHz were shown in FIG. 4a.

It could be seen that the minimum RL of the radar stealth-bulletproof integrated metamaterial appeared at 5.2 GHz, producing a strong absorption of −33.90 dB. The effective absorption bandwidth (RL≤−10 dB) was 8.5 GHz and 21.5 GHz in the low frequency band of 3~6.4 GHz and 10.7~15.8 GHz and the high frequency band of 18.5~40 GHz, respectively. The total bandwidth reached 30 GHz.

Example 3

Structural and performance parameters of individual layers of the lightweight, low-thickness, durable, and reliable multi-band radar stealth-bulletproof integrated metamaterial provided herein were described as follows.

Ceramic layer: thickness $a_1=5$ mm; density $\rho_1=3.2$ g/cm$^3$; material was silicon carbide; permittivity $\varepsilon_{r1}=3$; dielectric loss angle tangent value tan $\delta_{e1}=0.01$; shape of the ceramic piece was square, and side length of the square was 50 mm.

UHPEF-B: thickness $a_2=1.1$ mm; density $\rho_2=1.5$ g/cm$^3$; permittivity $\varepsilon_{r2}=12$; dielectric loss angle tangent value tan $\delta_{e2}=0.3$; permeability $\mu_2=4$; magnetic loss angle tangent value tan $\delta_{\mu2}=0.1$; $E_2=3.62$ GPa; $v_2=0.013$; $G_2=2$ GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was α-Fe and carbon nanotubes, accounting for 30 wt. % and 1 wt. % of the total mass of UHPEF-B, respectively.

Filter layer: total thickness $a_4=0.5$ mm; polyimide film as the substrate with thickness $a_{4(1)}=0.25$ mm; and rectangle-shaped surface pattern with thickness $a_{4(2)}=0.25$ mm, side length $a_{4(3)}=22$ mm, width $a_{4(4)}=3.5$ mm, and sheet resistance $R_4=5$ Ω/sq.

UHPEF-L: thickness $a_3=0.9$ mm; density $\rho_3=1.5$ g/cm$^3$; permittivity $\varepsilon_{r3}=12$; dielectric loss angle tangent value tan $\delta_{e3}=0.3$; permeability $\mu_3=4$; magnetic loss angle tangent value tan $\delta_{\mu3}=0.1$; $E_3=3.62$ GPa; $v_3=0.013$; and $G_3=2$ GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was α-Fe and carbon nanotubes, accounting for 30 wt. % and 1 wt. % of the total mass of UHPEF-L, respectively.

Reflective layer: thickness $a_5=4$ mm; density $\rho_5=2.19$ g/cm$^3$; electrical conductivity $\sigma_5=1\times10^4$ S/m; $\varepsilon_5=235$ GPa; $v_5=0.32$; and $G_5=4.5$ GPa. The reinforcement was carbon fiber plain fabric. The resin matrix was E-51 epoxy resin. The curing agent was HHPA. The mass ratio of the reinforcement to the resin matrix to the curing agent was 1:0.19:0.24.

Figure 4B:
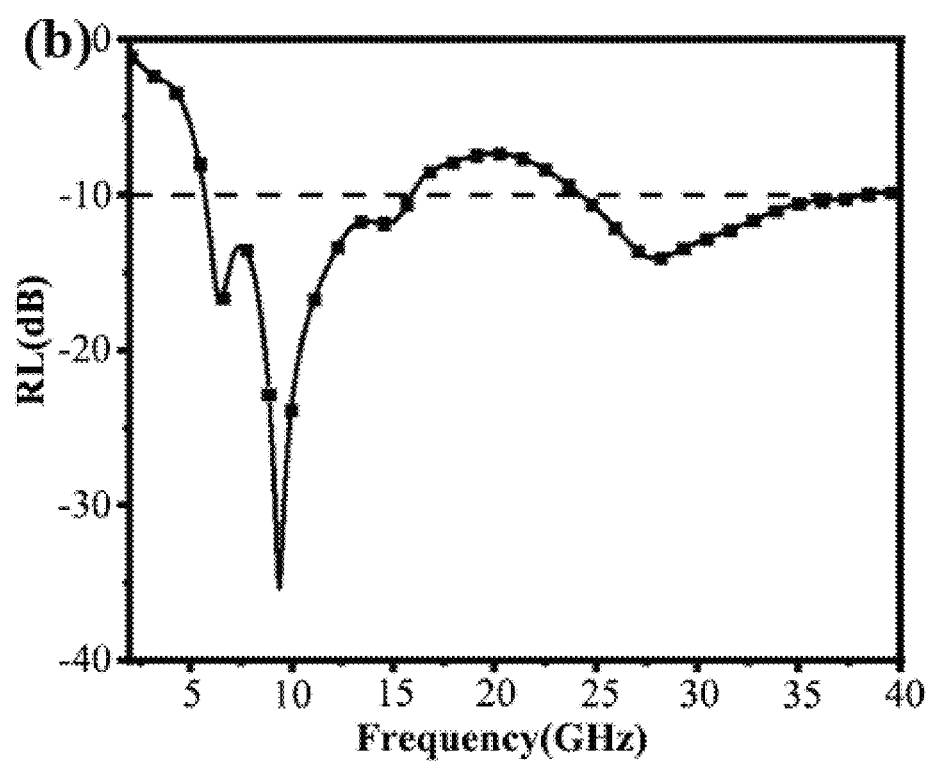

The curves of the radar wave reflection loss (RL) of the radar stealth-bulletproof integrated metamaterial in the radar wave frequency range of 2~40 GHz were shown in FIG. 4b.

It could be seen that the minimum RL of the radar stealth-bulletproof integrated metamaterial appeared at 9.4 GHz, which produced a strong absorption of −35.50 dB. The effective absorption bandwidth (RL≤−10 dB) was 10.1 GHz and 15.9 GHz in the low frequency band of 5.7~15.8 GHz and the high frequency band of 24.1~40 GHz, respectively. The total bandwidth reached 26 GHz.

Example 4

Structural and performance parameters of individual layers of the lightweight, low-thickness, durable, and reliable multi-band radar stealth-bulletproof integrated metamaterial provided herein were described as follows.

Ceramic layer: thickness $a_1$=5 mm; density $\rho_1$=2.52 g/cm$^3$; material was boron carbide; permittivity $\varepsilon_{r1}$=2; dielectric loss angle tangent value tan $\delta_{e1}$=0.001; and shape of the ceramic piece was square with side length of 100 mm.

UHPEF-B: thickness $a_2$=3 mm; density $\rho_2$=1.25 g/cm$^3$; permittivity $\varepsilon_{r2}$=5; dielectric loss angle tangent value tan $\delta_{e2}$=0.3; permeability $\mu_2$=2; magnetic loss angle tangent value tan $\delta_{\mu2}$=0.05; $E_2$=3.62 GPa; $\nu_2$=0.013; and $G_2$=2 GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was α-Fe and graphene, accounting for 15 wt. % and 0.3 wt. % of the total mass of UHPEF-B, respectively.

Filter layer: total thickness $a_4$=0.1 mm; polyimide film as the substrate with thickness $a_{4(1)}$=0.05 mm; rectangle-shaped surface pattern with thickness $a_{4(2)}$=0.05 mm, side length $a_{4(3)}$=20 mm, width $a_{4(4)}$=3 mm, and sheet resistance $R_4$=0.1 Ω/sq.

UHPEF-L: thickness $a_3$=3 mm; density $\rho_3$=0.99 g/cm$^3$; permittivity $\varepsilon_{r3}$=5; dielectric loss angle tangent value tan $\delta_{e3}$=0.3; permeability $\mu_3$=1; magnetic loss angle tangent value tan $\delta_{\mu3}$=0; $E_3$=3.62 GPa; $\nu_3$=0.013; and $G_3$=2 GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was graphene, accounting for 0.25 wt. % of the total mass of UHPEF-L.

Reflective layer: thickness $a_5$=1 mm; density $\rho_5$=2.19 g/cm$^3$; electrical conductivity $\sigma_5$=1×10$^5$ S/m; $\varepsilon_5$=235 GPa; $\nu_5$=0.32; and $G_5$=4.5 GPa. The reinforcement was carbon fiber plain fabric. The resin matrix was E-51 epoxy resin. The curing agent was HHPA. The mass ratio of the reinforcement to the resin matrix to the curing agent was 1:0.19:0.24.

Figure 4C:
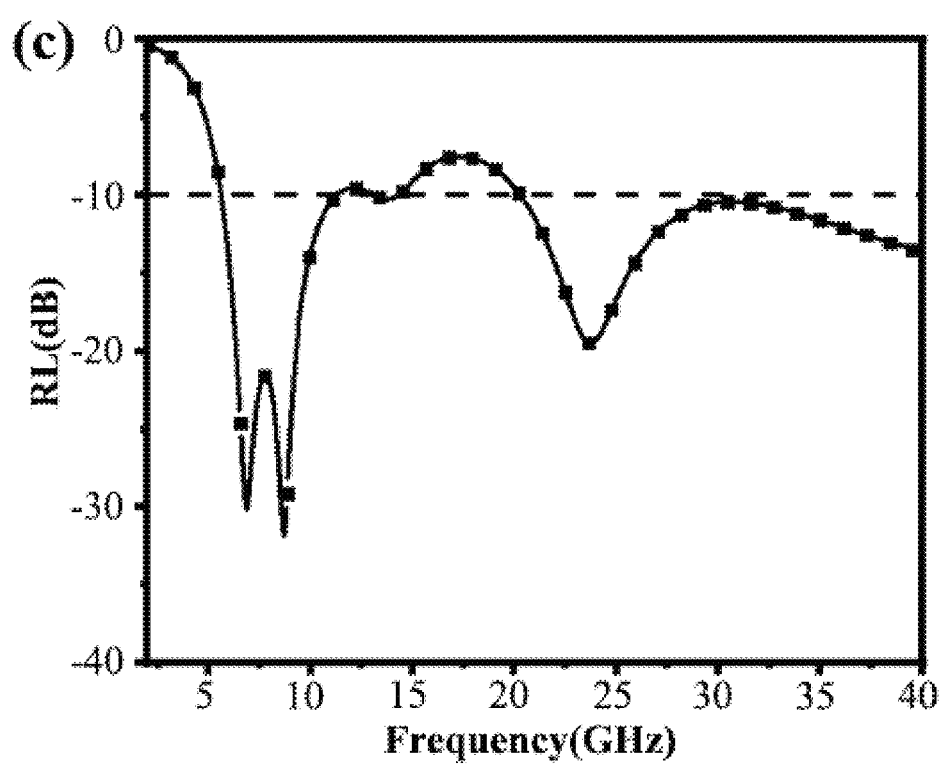

The curves of the radar wave reflection loss (RL) of the radar stealth-bulletproof integrated metamaterial in the radar wave frequency range of 2~40 GHz were shown in FIG. 4c.

It could be seen that the minimum RL of the radar stealth-bulletproof integrated metamaterial appeared at 8.7 GHz, which produced a strong absorption of −31.85 dB. The effective absorption bandwidth (RL≤−10 dB) was 5.7 GHz and 19.7 GHz in the low frequency band of 5.6~11.3 GHz and the high frequency band of 20.3~40 GHz, respectively. The total bandwidth reached 25.4 GHz.

Example 5

Structural and performance parameters of individual layers of the lightweight, low-thickness, durable, and reliable multi-band radar stealth-bulletproof integrated metamaterial provided herein were described as follows.

Ceramic layer: thickness $a_1$=5 mm; density $\rho_1$=2.52 g/cm$^3$; material was boron carbide; permittivity $\varepsilon_{r1}$=2; dielectric loss angle tangent value tan $\delta_{e1}$=0.001; and shape of ceramic piece was square with side length of 100 mm.

UHPEF-B: thickness $a_2$=3 mm; density $\rho_2$=1.25 g/cm$^3$; permittivity $\varepsilon_{r2}$=5; dielectric loss angle tangent value tan $\delta_{e2}$=0.3; permeability $\mu_2$=2; magnetic loss angle tangent value tan $\delta_{\mu2}$=0.05; $E_2$=3.62 GPa; $\nu_2$=0.013; and $G_2$=2 GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was α-Fe and graphene, accounting for 15 wt. % and 0.3 wt. % of the total mass of UHPEF-B, respectively.

Filter layer: total thickness $a_4$=0.1 mm; polyimide film as the substrate with thickness $a_{4(1)}$=0.05 mm; surface pattern of a zigzag shape (consisting of an outer rectangle and an inner square therein) with thickness $a_{4(2)}$=0.05 mm; length $a_{4(3)}$ of the outer rectangle=20 mm; width $a_{4(4)}$ of the outer rectangle=3 mm; side length $a_{4(5)}$ of the inner square=4 mm; and sheet resistance $R_4$=0.1 Ω/sq.

UHPEF-L: thickness $a_3$=3 mm; density $\rho_3$=0.99 g/cm$^3$; permittivity $\varepsilon_{r3}$=5; dielectric loss angle tangent value tan $\delta_{e3}$=0.3; permeability $\mu_3$=1; magnetic loss angle tangent value tan $\delta_{\mu3}$=0; $E_3$=3.62 GPa; $\nu_3$=0.013; and $G_3$=2 GPa. The reinforcement was UHMWPE fiber unidirectional fabric. The resin matrix was E-51 epoxy resin. The curing agent was HHPA. The mass ratio of the reinforcement to the resin matrix to the curing agent was 1:0.24:0.3. The added wave-absorbing filler was graphene, accounting for 0.25 wt. % of the total mass of UHPEF-L.

Reflective layer: thickness $a_5$=1 mm; density $\rho_5$=2.19 g/cm$^3$; electrical conductivity $\sigma_5$=1×10$^5$ S/m; $E_5$=235 GPa; $\nu_5$=0.32; and $G_5$=4.5 GPa. The reinforcement was carbon fiber plain fabric. The resin matrix was E-51 epoxy resin. The curing agent was HHPA. The mass ratio of the reinforcement to the resin matrix to the curing agent was 1:0.19:0.24.

Figure 4D:
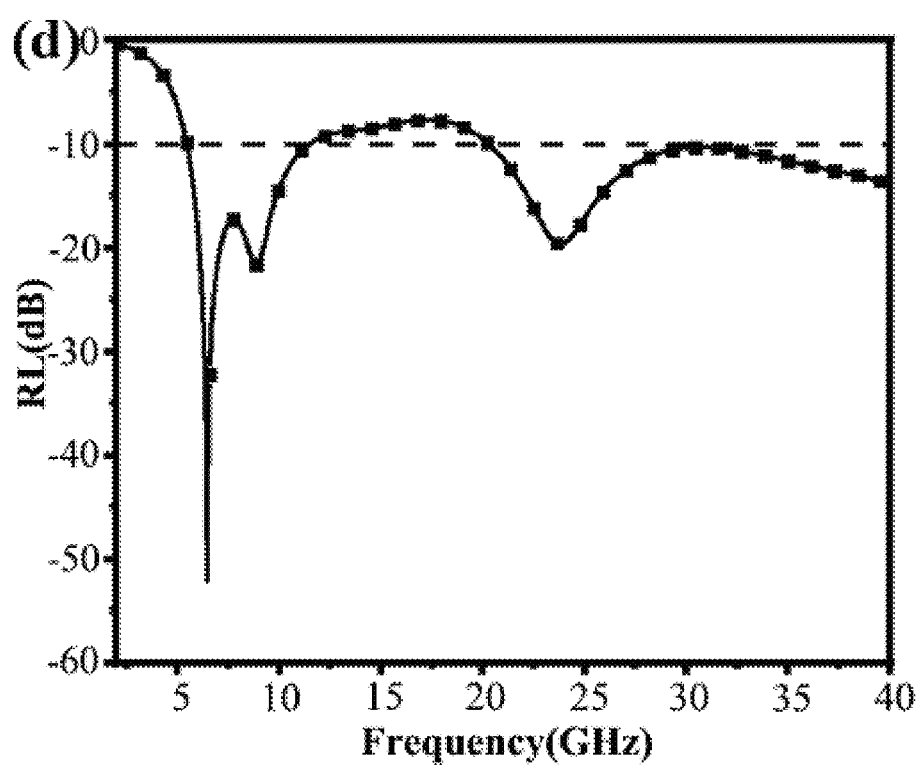

The curves of the radar wave reflection loss (RL) of the radar stealth-bulletproof integrated metamaterial in the radar wave frequency range of 2-40 GHz were shown in FIG. 4d.

It could be seen that the minimum RL of the radar stealth-bulletproof integrated metamaterial appeared at 6.4 GHz, producing a strong absorption of −52.05 dB. The effective absorption bandwidth (RL≤−10 dB) was 6.0 GHz and 19.6 GHz in the low frequency band of 5.4~11.5 GHz and the high frequency band of 20.4~40 GHz, respectively. The total bandwidth was 25.6 GHz.

Comparative Example 1

Figure 5A:
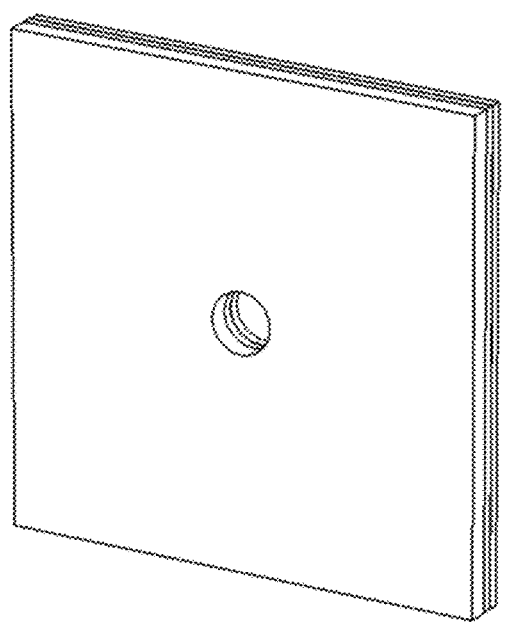
FIGS. 5a and 5b schematically show a simulation model and a corresponding perspective view according to Comparative Example 1 of the present disclosure.
Figure 5B:
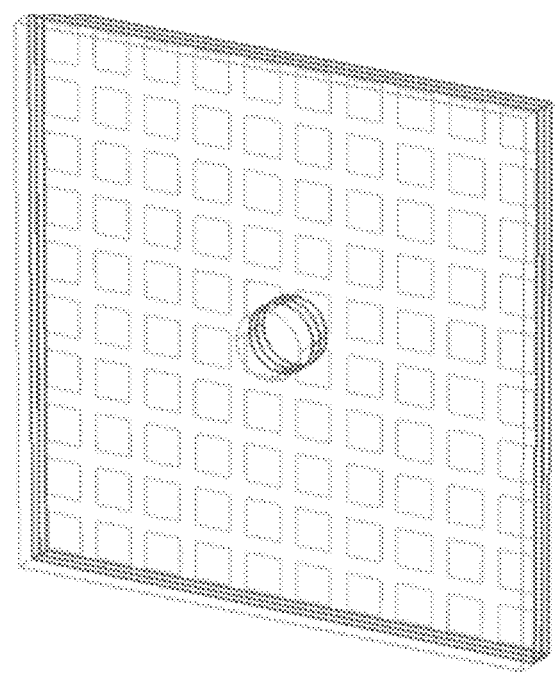

To illustrate that the disclosure can still maintain the ability to respond to radar detection after suffering a certain degree of damage, in Comparative Example 1, the wave absorption performance of the integrated metamaterial in Example 2 after suffering damage was simulated. As shown in FIG. 5, a through-hole with the diameter of 14.5 mm was set in the center of the 10×10 cell array to simulate damage after a bullet penetration. The wave absorption performance of the integrated metamaterial after the damage was shown in FIG. 4a.

FIG. 4a showed that, compared with the results of Example 2, it could be seen that the minimum RL of the integrated metamaterial changed slightly after suffering penetrating damage, producing an absorption of −30.38 dB at 5.3 GHz, but still maintaining the multi-band absorption performance where the effective absorption bandwidth (RL≤−10 dB) was 8.5 GHz and 21.5 GHz in the low frequency band of 3~6.4 GHz and 10.7~15.8 GHz and the high frequency band of 18.5~40 GHz, respectively, and the total bandwidth was 30 GHz.

In conclusion, the disclosure not only achieves an effective combination of protection function against conventional bullet impact and stealth function under multi-band radar wave detection, so as to reduce thickness and weight, but also has excellent reliability in maintaining the wave-absorbing stealth capability after undergoing damage.

Described above are merely some embodiments of the disclosure to help those skilled in the art to understand or implement the disclosure. It should be understood that any modifications and replacements made by those skilled in the art without departing from the spirit of the disclosure should fall within the scope of the disclosure defined by the appended claims.

What is claimed is:

1. A multi-band radar stealth-bulletproof integrated metamaterial, comprising:
    a ceramic layer;
    a bulletproof layer;
    a filter layer;
    an attenuation layer; and
    a reflective layer;
    wherein the ceramic layer, the bulletproof layer, the filter layer, the attenuation layer, and the reflective layer are stacked in sequence, and the ceramic layer serves as a projectile facing surface; the bulletproof layer is made of a first ultrahigh molecular weight polyethylene (UHMWPE) fiber composite; the filter layer is a graphene-based metamaterial layer; the attenuation layer is made of a second UHMWPE fiber composite; and the reflective layer is a carbon fiber-based composite layer;
    the bulletproof layer and the attenuate layer serve to attenuate incident radar waves;
    a circuit resonance of the filter layer serves to simultaneously generate a passband and a stopband for the incident radar waves;
    the bulletproof layer and the attenuation layer serve to be controlled by the filter layer in terms of working conditions within different incident radar frequency bands to establish a structure capable of generating $\lambda/4$ resonance at both low and high frequencies;
    the ceramic layer is formed by splicing a plurality of ceramic pieces in a shape of triangle, square, or hexagon; and
    each of the plurality of ceramic pieces has a thickness $a_1$ of 5~10 mm, a side length of 50~100 mm, a density $\rho_1$ of 1~5 g/cm$^3$, a permittivity $\varepsilon_{r1}$ of 2~3, and a dielectric loss angle tangent value tan $\delta_{e1}$ of 0.001~0.01.

2. The multi-band radar stealth-bulletproof integrated metamaterial of claim 1, wherein the bulletproof layer is an UHMWPE fiber-resin composite layer having a thickness $a_2$ of 1.1~5 mm, a density $\rho_2$ of 0.5~2 g/cm$^3$, a permittivity $\varepsilon_{r2}$ of 5~12, a dielectric loss angle tangent value tan $\delta_{e2}$ of 0.2~0.3, a permeability $\mu_2$ of 2~4, a magnetic loss angle tangent value tan $\delta_{\mu2}$ of 0.05~0.1, a Young's modulus $E_2$ of 0.1~10 GPa, a Poisson's ratio $v_2$ of 0.01~0.02, and a shear modulus $G_2$ of 0.1~3 GPa.

3. The multi-band radar stealth-bulletproof integrated metamaterial of claim 2, wherein the UHMWPE fiber-resin composite layer comprises a reinforcement, a resin matrix, a curing agent, and a wave-absorbing filler;
    the reinforcement is selected from the group consisting of UHMWPE fiber plain fabric, UHMWPE fiber twill fabric, UHMWPE fiber unidirectional fabric, and a combination thereof;
    the resin matrix is epoxy resin;
    the curing agent is an amine-based curing agent or an anhydride-based curing agent; and
    the wave-absorbing filler is selected from the group consisting of graphene, carbon nanotube, ferroferric oxide, carbonyl iron, a-Fe, and a combination thereof.

4. The multi-band radar stealth-bulletproof integrated metamaterial of claim 1, wherein the filter layer comprises a polyimide film as a substrate and conductive graphene as a pattern layer; a total thickness $a_4$ of the filter layer is 0.1-0.5 mm; and sheet resistance $R_4$ of the filter layer is 0.1-5 Ω/sq.

5. The multi-band radar stealth-bulletproof integrated metamaterial of claim 1, wherein the attenuation layer is an UHMWPE fiber-resin composite layer having a thickness $a_3$ of 0.9~5 mm, a density $\rho_3$ of 0.5~2 g/cm$^3$, a permittivity $\varepsilon_{r3}$ of 5~12, a dielectric loss angle tangent value tan $\delta_{e3}$ of 0.2~0.3, a permeability $\mu_3$ of 1~4, a magnetic loss angle tangent value tan $\delta_{\mu3}$ of 0~0.1, a Young's modulus $E_3$ of 0.1~10 GPa, a Poisson's ratio $v_3$ of 0.01~0.02, and a shear modulus $G_3$ of 0.1~3 GPa.

6. The multi-band radar stealth-bulletproof integrated metamaterial of claim 5, wherein the UHMWPE fiber-resin composite layer comprises a reinforcement, a resin matrix, a curing agent, and a wave-absorbing filler;
    the reinforcement is selected from the group consisting of UHMWPE fiber plain fabric, UHMWPE fiber twill fabric, UHMWPE fiber unidirectional fabric, and a combination thereof;
    the resin matrix is epoxy resin;
    the curing agent is an amine-based curing agent or an anhydride-based curing agent; and
    the wave-absorbing filler is selected from the group consisting of graphene, carbon nanotube, ferroferric oxide, carbonyl iron, a-Fe, and a combination thereof.

7. The multi-band radar stealth-bulletproof integrated metamaterial of claim 1, wherein the reflective layer is a carbon fiber-resin composite layer having a thickness as of 1~4 mm, a density $\rho_5$ of 2~4 g/cm$^3$, an electrical conductivity $\sigma_5$ of 10$^4$~10$^5$ S/m, a Young's modulus $E_5$ of 10~300 GPa, a Poisson's ratio vs of 0.3~0.4, and a shear modulus $G_5$ of 0.1~5 GPa.

8. The multi-band radar stealth-bulletproof integrated metamaterial of claim 7, wherein the carbon fiber-resin composite layer comprises a reinforcement, a resin matrix, and a curing agent;
    the reinforcement is selected from the group consisting of carbon fiber plain fabric, carbon fiber twill fabric, carbon fiber unidirectional fabric, and a combination thereof;
    the resin matrix is epoxy resin; and
    the curing agent is an amine-based curing agent or an anhydride-based curing agent.

9. The multi-band radar stealth-bulletproof integrated metamaterial of claim 1, wherein each of the plurality of ceramic pieces is made from boron carbide, boron nitride, alumina, silicon carbide, silicon nitride, or a combination thereof.

* * * * *